(12) United States Patent
Fiorenza et al.

(10) Patent No.: US 8,034,697 B2
(45) Date of Patent: Oct. 11, 2011

(54) FORMATION OF DEVICES BY EPITAXIAL LAYER OVERGROWTH

(75) Inventors: James Fiorenza, Wilmington, MA (US); Anthony Lochtefeld, Ipswich, MA (US); Jie Bai, Bedford, MA (US); Ji-Soo Park, Methuen, MA (US); Jennifer Hydrick, Kingston, NH (US); Jizhong Li, Bordentown, NJ (US); Zhiyuan Cheng, Lincoln, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/680,872

(22) PCT Filed: Sep. 18, 2009

(86) PCT No.: PCT/US2009/057493
§ 371 (c)(1),
(2), (4) Date: Mar. 30, 2010

(87) PCT Pub. No.: WO2010/033813
PCT Pub. Date: Mar. 25, 2010

(65) Prior Publication Data
US 2010/0216277 A1    Aug. 26, 2010

Related U.S. Application Data

(60) Provisional application No. 61/098,597, filed on Sep. 19, 2008, provisional application No. 61/099,074, filed on Sep. 22, 2008, provisional application No. 61/104,466, filed on Oct. 10, 2008.

(51) Int. Cl.
*H01L 21/20* (2006.01)
*H01L 21/36* (2006.01)

(52) U.S. Cl. ............... 438/481; 257/E21.09; 438/94
(58) Field of Classification Search ............ 257/E21.09; 438/94, 481
See application file for complete search history.

(56) References Cited

U.S. PATENT DOCUMENTS
6,325,850 B1    12/2001    Beaumont et al.
(Continued)

OTHER PUBLICATIONS

PCT International Search Report of PCT/US2009/057493, form PCT/ISA/210, mailed Mar. 22, 2010, Applicant: Amberwave System Corporation et al., 3 pages.

*Primary Examiner* — Asok Sarkar
(74) *Attorney, Agent, or Firm* — Slater & Matsil, L.L.P.

(57) ABSTRACT

Methods and structures are provided for formation of devices, e.g., solar cells, on substrates including, e.g., lattice-mismatched materials, by the use of aspect ratio trapping (ART) and epitaxial layer overgrowth (ELO). In general, in a first aspect, embodiments of the invention may include a method of forming a structure. The method includes forming a first opening in a masking layer disposed over a substrate that includes a first semiconductor material. A first layer, which includes a second semi-conductor material lattice-mismatched to the first semiconductor material, is formed within the first opening. The first layer has a thickness sufficient to extend above a top surface of the masking layer. A second layer, which includes the second semiconductor material, is formed on the first layer and over at least a portion of the masking layer. A vertical growth rate of the first layer is greater than a lateral growth rate of the first layer and a lateral growth rate of the second layer is greater than a vertical growth rate of the second layer.

28 Claims, 5 Drawing Sheets

U.S. PATENT DOCUMENTS

| | | |
|---|---|---|
| 6,576,532 B1 | 6/2003 | Jones et al. |
| 6,809,351 B2 | 10/2004 | Kuramoto et al. |
| 6,812,053 B1 | 11/2004 | Kong et al. |
| 6,831,350 B1 | 12/2004 | Liu et al. |
| 6,919,258 B2 | 7/2005 | Grant et al. |
| 7,012,314 B2 | 3/2006 | Bude et al. |
| 7,015,517 B2 | 3/2006 | Grant et al. |
| 7,297,569 B2 | 11/2007 | Bude et al. |
| 7,361,576 B2 | 4/2008 | Imer et al. |
| 2006/0057825 A1 | 3/2006 | Bude et al. |
| 2006/0073681 A1* | 4/2006 | Han ............... 438/479 |
| 2006/0292719 A1* | 12/2006 | Lochtefeld et al. ........ 438/22 |
| 2007/0099329 A1* | 5/2007 | Maa et al. ............... 438/57 |
| 2008/0187018 A1 | 8/2008 | Li |
| 2009/0072284 A1 | 3/2009 | King et al. |

* cited by examiner

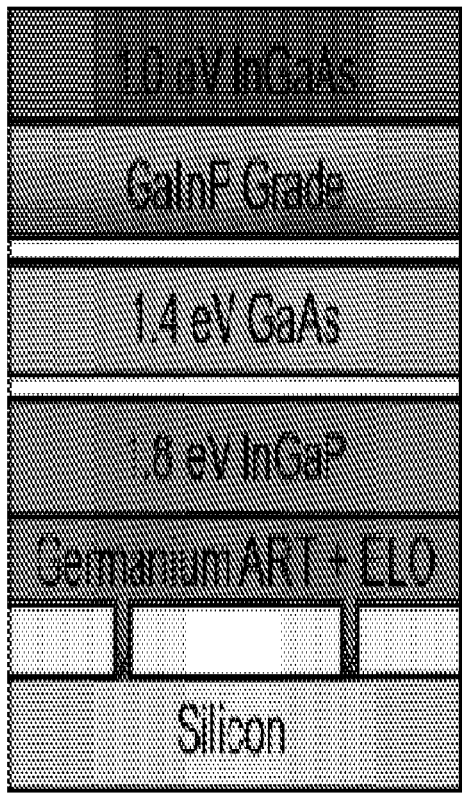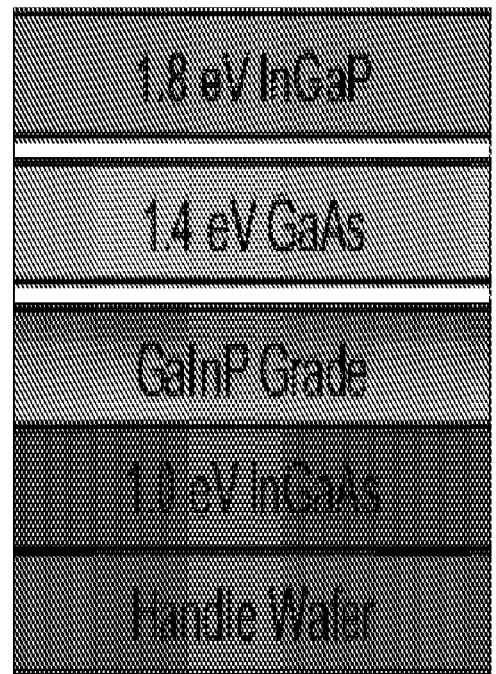
Fig. 5a — 1) Inverted Growth on Ge ART + ELO
Fig. 5b — 2) Flip, Bond, Selectively Remove Substrate

US 8,034,697 B2

FORMATION OF DEVICES BY EPITAXIAL LAYER OVERGROWTH

CROSS-REFERENCE TO RELATED APPLICATIONS

The present application is the National Stage of International Application No. PCT/US09/57493, filed Sep. 18, 2009, entitled "Formation of Devices by Epitaxial Layer Overgrowth;" which application claims priority from the following U.S. provisional patent applications: U.S. Ser. No. 61/098,597, filed Sep. 19, 2008, entitled "Formation of Devices by Epitaxial Layer Overgrowth"; U.S. Ser. No. 61/099,074, filed Sep. 22, 2008, entitled "Light Emitting Devices Formed with Aspect Ration Trapping and Epitaxial Lateral Overgrowth"; and U.S. Ser. No. 61/104,466, filed Oct. 10, 2008, entitled "Hybrid Applications Using Aspect-Ration Trapping, Epitaxial-Layer Overgrowth, and Wafer Bonding." All of the above applications are incorporated by reference herein and for which benefit of the priority dates are hereby claimed.

BACKGROUND OF THE INVENTION

1. Field of the Invention

The present invention relates to fabrication or structures including a semiconductor crystalline material. For example, improved epitaxial growth or structures may occur over a planarized surface including a semiconductor crystalline material.

2. Description of the Related Art

This section provides background information and introduces information related to various aspects of the disclosure that are described and/or claimed below. These background statements are not admissions of prior art.

Techniques involving substrate patterning exploit the fact that the threading dislocations are constrained by geometry, i.e. that a dislocation cannot end in a crystal. If the free edge is brought closer to another free edge by patterning the substrate into smaller growth areas, then it is possible to reduce threading dislocation densities. In the past, a combination of substrate patterning and epitaxial lateral overgrowth ("ELO") techniques was demonstrated to greatly reduce defect densities in gallium nitride device, leading to fabrication of laser diodes with extended lifetimes. This process substantially eliminates defects in ELO regions but highly defective seed windows remain, necessitating repetition of the lithography and epitaxial steps to eliminate all defects. In a similar approach, pendeo-epitaxy eliminates substantially all defects in the epitaxial region proximate to the substrate but requires one lithography and two epitaxial growth steps. Furthermore, both techniques require the increased lateral growth rate of gallium nitride, which has not been demonstrated in all heteroepitaxial systems.

Another known technique termed "epitaxial necking" was demonstrated in connection with fabricating a Ge-on-Si heterostructure by Langdo et al. in "High Quality Ge on Si by Epitaxial Necking," Applied Physics Letters, Vol. 76, No. 25, April 2000. This approach offers process simplicity by utilizing a combination of selective epitaxial growth and defect crystallography to force defects to the sidewall of the opening in the patterning mask, without relying on increased lateral growth rates. Specifically, in the (111)<110> diamond cubic slip system, misfit dislocations lie along <110> directions in the (100) growth plane while the threading segments rise up on (111) planes in <110> directions. Threading segments in <110> directions on the (111) plane propagate at a 45° angle to the underlying Si (100) substrate surface. Thus, if the aspect ratio of the holes in the patterning mask is greater than 1, threading segments will be blocked by the mask sidewall, resulting in low-defect top Ge "nodules" formed directly on Si. One important limitation of epitaxial necking, however, is the size of the area to which it applies. In general, as discussed in more detail below, the lateral dimensions in both dimensions have to be relatively small in order for the dislocations to terminate at sidewalls.

Thus, there is a need in the art for versatile and efficient methods of fabricating semiconductor heterostructures that would constrain dislocation defects in a variety of lattice-mismatched materials systems. There is also a need in the art for semiconductor devices utilizing a combination of integrated lattice-mismatched materials with reduced levels of dislocation defects for improved functionality and performance.

BRIEF SUMMARY OF THE INVENTION

Methods and structures are provided for formation of devices, e.g., solar cells, on substrates including, e.g., lattice-mismatched materials, by the use of aspect ratio trapping (ART) and epitaxial layer overgrowth (ELO).

In general, in a first aspect, embodiments of the invention may include a method of forming a structure. The method includes forming a first opening in a masking layer disposed over a substrate that includes a first semiconductor material. A first layer, which includes a second semiconductor material lattice-mismatched to the first semiconductor material, is formed within the first opening. The first layer has a thickness sufficient to extend above a top surface of the masking layer. A second layer, which includes the second semiconductor material, is formed on the first layer and over at least a portion of the masking layer. A vertical growth rate of the first layer is greater than a lateral growth rate of the first layer and a lateral growth rate of the second layer is greater than a vertical growth rate of the second layer.

One or more of the following features may be included. A second opening may be formed in the masking layer prior to forming the first layer, and the first layer may be formed within the second opening prior to forming the second layer. A third layer, which includes the second semiconductor material, is formed on the second layer. The third layer coalesces between the first opening and the second opening.

Dislocation defects in the first layer may be trapped within the first opening. The vertical growth rate of the first layer may be increased by doping the first layer during formation thereof. The lateral growth rate of the first layer may be reduced by doping the first layer during formation thereof. The lateral growth rate of the first layer may be reduced by adjusting the growth parameters to create facets on a top surface of the first layer during formation thereof. Reducing the vertical growth rate of the second layer may include doping the second layer during formation thereof.

Reducing the vertical growth rate of the second layer may include doping the second layer during formation thereof to form a first type of facet in the second layer and to suppress formation of a second type of facet in the second layer. Increasing the lateral growth rate of the second layer may include doping the second layer during formation thereof. The coalescence of the third layer may be facilitated by doping the third layer during formation thereof. Coalescence of the third layer between the first opening and the second opening may be facilitated by doping the third layer during formation thereof.

Doping the third layer may slow facet growth in the third layer and reduces stacking fault formation in the third layer. The second semiconductor material may include germanium. The second semiconductor material may include p-type dopants. Forming at least one of the first, second, or third layers may include epitaxial growth. Forming the first layer may include using germanium tetrachloride as a precursor. The method may further include, after forming the third layer, removing a top portion of the third layer to remove defects. The method may further include forming a photonic device on the third layer after the top portion is removed. A top portion of the first layer may define a facet non-parallel to a top surface of the substrate. The third layer may be self-planarizing. The third layer may be self-planarized by growing the third layer primarily in a (100) direction.

The method may further include forming a fourth layer on top of the third layer, the fourth layer including a third semiconductor material. A fifth layer may be formed on top of the fourth layer, the fifth layer including a fourth semiconductor material. A handle wafer may be bonded to the fifth layer and the substrate may be removed. The third semiconductor material and the fourth semiconductor material each may include III-V materials. The substrate may include silicon. The handle wafer may include a metal. A bandgap of the third semiconductor material may be greater than a bandgap of the fourth semiconductor material. The structure may include a multi junction photovoltaic cell.

In general, in another aspect, embodiments of the invention may include a method of forming a structure. The method includes forming an opening having a width $w_1$ in a masking layer disposed over a substrate, the substrate including a first semiconductor material. A first layer, which includes a second semiconductor material lattice-mismatched to the first semiconductor material, may be formed within the opening. The first layer extends vertically above a top surface of the masking layer and laterally to a width $w_2$ greater than $w_1$. A portion of the first layer is removed, and a remainder of the first layer has a thickness $t_1$ over a first area of the substrate proximate the opening. A second layer, which includes the second semiconductor material, is formed on the first layer and extends laterally to a width $w_3$ greater than $w_2$. A portion of the second layer is removed, and a remainder of the second layer has a thickness $t_2$ over a second area of the substrate proximate the opening.

One or more of the following features may be included. In various embodiments, $t_1$ equals $t_2$. Removing the portion of the first layer may include at least one of etching or chemical-mechanical polishing. The steps of forming the first layer and removing the portion of the first layer may be performed in different machines. The steps of forming the first layer and removing the portion of the first layer may be performed in the same machine. Dislocation defects in the second semiconductor material may be trapped in the opening. A portion of the first layer above the surface of the substrate may be substantially free of dislocation defects. A vertical growth rate of the second semiconductor material may be greater than a lateral growth rate of the second semiconductor material.

A sidewall of the opening may include a dielectric material. Epitaxial growth may be used to form at least one of the first layer and second layer. The method may further include forming the first layer using germanium tetrachloride as a precursor, after forming the second layer, removing a top portion of the second layer, and/or forming a photonic device on the second layer. A top portion of the first layer may define a facet non-parallel to a top surface of the substrate. The second layer may be self-planarizing. The second layer may be self-planarized by growing the second layer primarily in a (100) direction.

The method may further include forming a third layer on top of the second layer, the third layer including a third semiconductor material. A fourth layer, which may include a fourth semiconductor material, may be formed on top of the third layer. The fourth layer may be bonded to a handle wafer and the substrate may be removed. The third semiconductor material and the fourth semiconductor material may include III-V materials, the substrate may include silicon, and the handle wafer may include a metal. A bandgap of the third semiconductor material may be greater than a bandgap of the fourth semiconductor material. The structure may include a multi junction photovoltaic cell.

In general, in yet another aspect, embodiments of the invention may include a method of forming a layer. The method includes forming a first opening in a masking layer disposed over a substrate. A first layer, which includes a cubic semiconductor material, is formed in the first opening. The first layer has a thickness sufficient to extend vertically above a top surface of the substrate. A second layer, which also includes the cubic semiconductor material, is formed on the first layer. A vertical growth rate of the first layer is greater than a lateral growth rate of the first layer and a lateral growth rate of the second layer is greater than a vertical growth rate of the second layer.

Embodiments of the method may further include, prior to forming the first layer, forming a second opening in masking layer. Prior to forming the second layer, a first layer may be formed within the second opening. The second layer may be coalesced between the first opening and the second opening. The masking layer may include semiconductor a dielectric material. The first opening in the substrate may include a (110) surface and the substrate may include silicon. The method may further include trapping dislocation defects in the first layer in the first opening. Decreasing the vertical growth rate of the second layer and increasing the lateral growth of the second layer may include changing growth conditions. The growth conditions may include 0.1 atmospheres and 750° C.

The cubic semiconductor material may include germanium, GaAs, InP, or other III-V materials. The cubic semiconductor material may be doped. Defects in the first layer are trapped in the first opening. A device may be formed in the second layer. The device may be a photonic device. A top portion of the second layer may be etched. A top portion of the first layer may define a facet non-parallel to a top surface of the substrate. The second layer may be self-planarizing. The second layer may be self-planarized by growing the second layer primarily in a (100) direction.

The method may further include forming a third layer on top of the second layer, the third layer including a third semiconductor material. A fourth layer, which may include a fourth semiconductor material, may be formed on top of the third layer. The fourth layer may be bonded to a handle wafer and the substrate may be removed. The third semiconductor material and the fourth semiconductor material may include III-V materials, the substrate may include silicon, and the handle wafer may include a metal. A bandgap of the third semiconductor material may be greater than a bandgap of the fourth semiconductor material. The structure may include a multi junction photovoltaic cell.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIGS. 5a and 5b are diagrams that illustrate a cross-sectional schematic of inverse solar cell grown on a Ge ART and ELO substrate.

DETAILED DESCRIPTION

Fundamental ART processes, including lift-off technologies, are described in detail in U.S. patent application Ser. No. 12/147,027 filed on Jun. 26, 2008 entitled "Multi-Junction Solar Cell". The formation of solar cells using ART techniques is described in U.S. patent application Ser. No. 12/180,254 filed on Jul. 25, 2008 entitled "Lattice-mismatched semiconductor structures with reduced dislocation defect densities and related methods for device fabrication".

Figure 1:
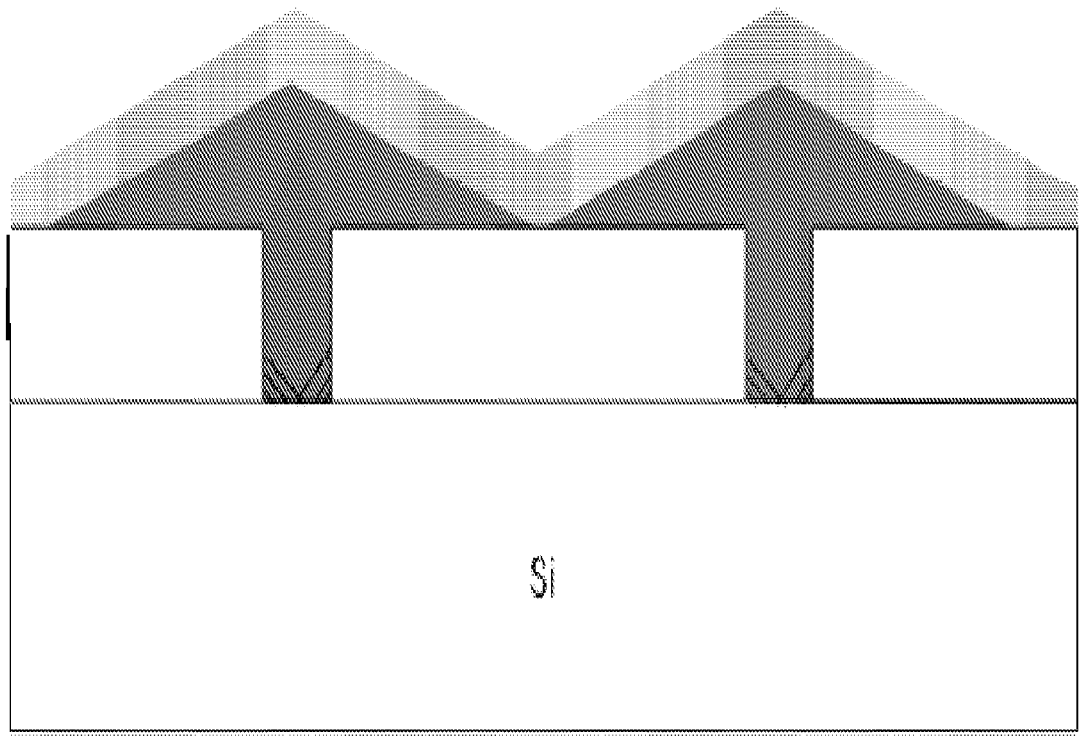
FIG. 1 is a diagram that illustrates a cross-sectional schematic of utilizing ELO, controlled by the use of impurities in trenches using ART.

Embodiments of the invention utilizing ELO, controlled by the use of impurities, are set forth in FIG. 1. ELO may be performed on wafers by employing the control of faceting. Faceting may be controlled, for example, by varying impurity levels in a material, varying the growth temperature, varying the growth pressure, varying the precursor gas flow rates, and/or varying the precursor chemical composition. The control of faceting may be desirable for at least two purposes: (i) to increase ELO lateral growth for a given vertical growth, and (ii) to reduce stacking faults or dislocations during coalescence. In an embodiment, faceting of germanium on Si (100) wafers formed in (110) trenches may be controlled using known faceting behavior. The same technique may be applied to other materials and orientations as well. The illustrative embodiment shows the application of faceting control to a combination of ART and ELO, but the technique may also be applied to only ELO.

Figure 2:
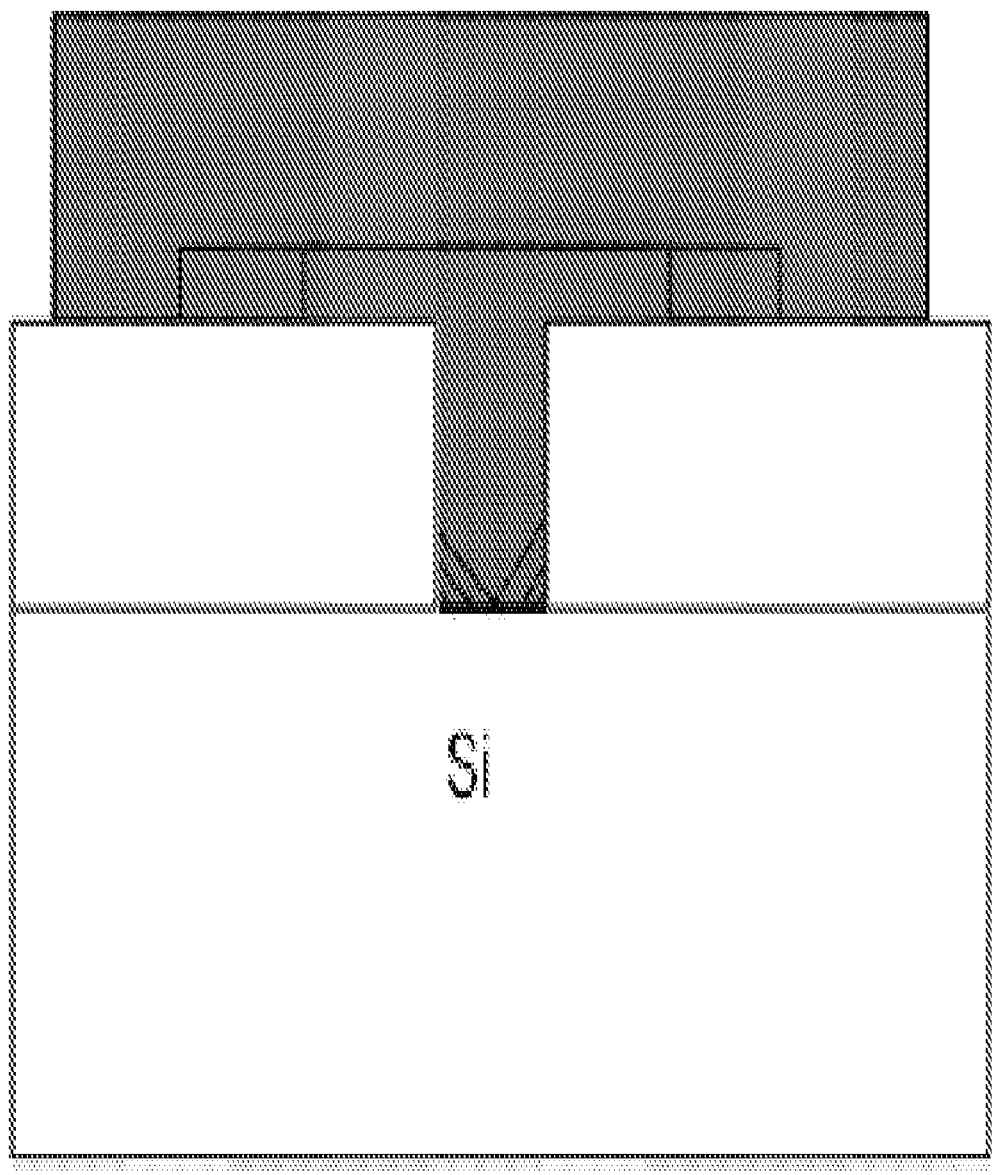
FIG. 2 is a diagram that illustrates a cross-sectional schematic of utilizing ELO with repeated removal and regrowth of layers in trenches using ART.

Other embodiments of the invention utilize ELO with repeated removal and regrowth of layers, as set forth in FIG. 2. ELO is a technique used to grow mismatched epitaxy. A maximum lateral overgrowth length may be limited by a maximum allowable thickness of the film. A lateral overgrowth length may be increased by repeatedly thinning the film and re-growing. The thinning and re-growth steps may be performed in different machines, or could happen in the same machine. This technique may be used with ART or with traditional ELO.

Figure 3:
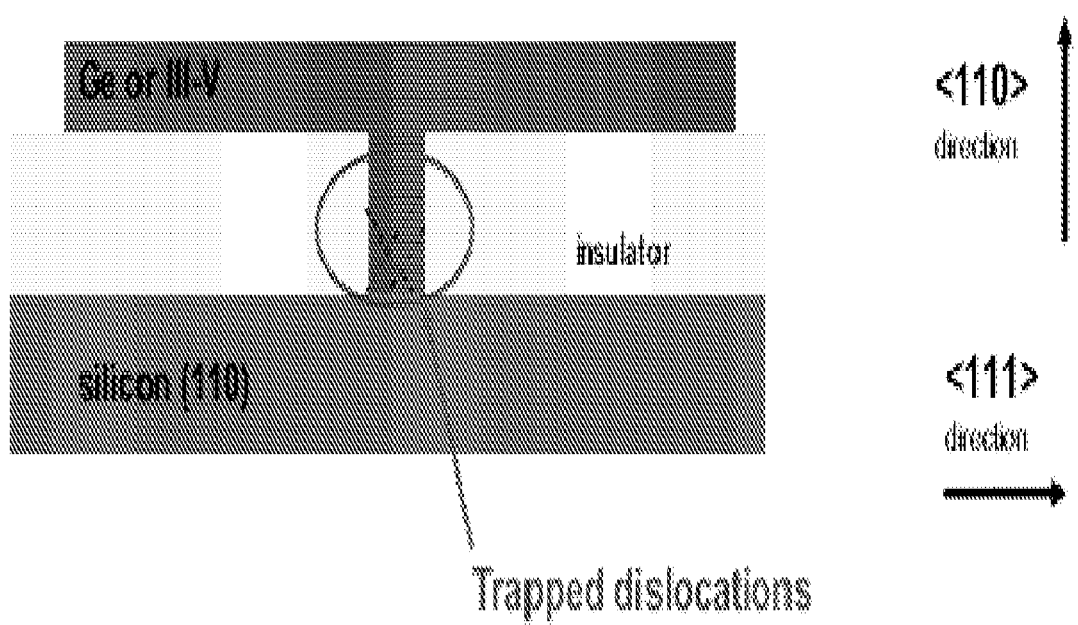
FIG. 3 is a diagram that illustrates a cross-sectional schematic of utilizing ELO of cubic semiconducting materials in trenches using ART.

Still other embodiments of the invention provide methods for effective ELO of cubic semiconducting materials, as set forth in FIG. 3. GaN and other III-N semiconductors have a hexagonal crystal structure. Conditions that favor a high ratio of horizontal to vertical growth rates ($GR_{horizontal}/GR_{vertical}$) have not been shown for cubic semiconducting materials such as Ge, or III-V's such as GaAs or InP. This fact makes use of ELO much more difficult. A possible solution is to selectively control vertical and horizontal growth rates. In an exemplary process, one may start with a (110)-surface substrate, e.g. silicon (110). An insulator is deposited and patterned thereover. A Ge or III-V cubic material is grown, e.g. under growth conditions conducive to both vertical and horizontal growth. Then, parameters are switched to growth conditions that allow almost no growth in <110> direction, but significant growth in a direction perpendicular to <110>, such as <111> directions. See Noborisaka et al., Applied Physics Letters 86 213102 (2005), and Noborisaka et al., Applied Physics Letters 87 093109 (2005). The key here is using a (110) substrate. This, in effect, allows one to move from a high $GR_{vertical}/GR_{horizontal}$ to a high $GR_{horizontal}/GR_{vertical}$, which is preferred for ELO.

Figure 4:
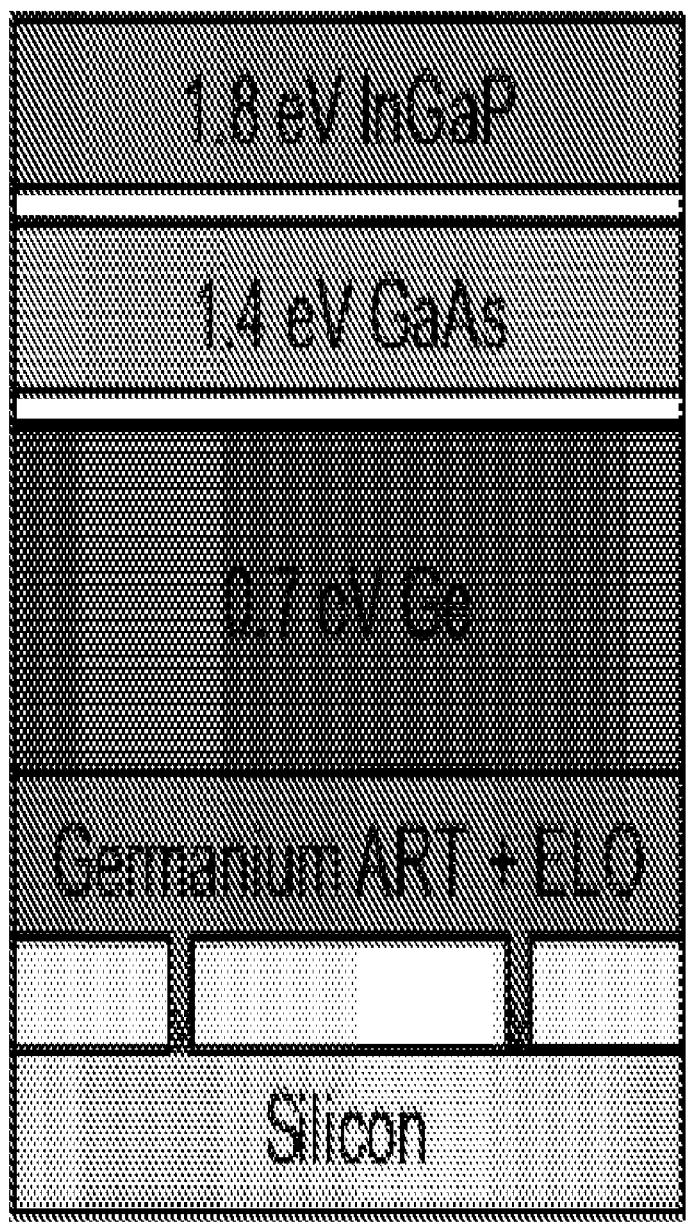
FIG. 4 is a diagram that illustrates a cross-sectional schematic of utilizing formation of solar cells by the use of ART and ELO.

Embodiments of the invention including the formation of solar cells by the use of ART and ELO are set forth in FIG. 4. The FIG. 4 shows Ge ART+ELO being used to replace a germanium substrate in a conventional multi junction configuration. In the conventional configuration, a GaAs p/n junction and an InGaP p/n junction are grown on a germanium wafer. The InGaP junction has a high band-gap (1.8 eV) and collects the highest energy light, the GaAs junction (1.4 eV) has a medium-level band-gap and collects the medium energy light. In the conventional configuration, the lowest energy light is collected by a germanium p/n junction that is formed on top of the Germanium wafer.

The conventional configuration may not work well if Ge ART+ELO is used to replace the germanium wafer. There are two reasons for this. First, the germanium cell used in the conventional configuration may be too thick. The coefficient of thermal expansion (CTE) of germanium is much different from the coefficient of thermal expansion (CTE) of silicon. Germanium grown is typically not stressed at the growth temperature, but is stressed after the cool down. Cracks may form in the germanium to relieve the stress if the germanium is grown too thick. The thickness that may lead to cracks is approximately between 5-10 microns; the exact thickness depends on the growth temperature. The germanium cell used in the conventional multi junction configuration is preferably at least 20 microns thick. This thickness is preferred because germanium is not a very good absorber of light because the band-gap of germanium is indirect. If the germanium cell is made too thin, much of the light may pass through the germanium cell without being absorbed, which is likely to reduce the efficiency of the cell. This thickness is also required because of current matching: if the germanium cell is too thin, the current that may be produced in the bottom cell may be lower than that which may be produced in the top cell, thereby reducing the current in a series connected device and thus its efficiency.

The second reason that the conventional configuration may not work well with Ge ART+ELO is because of the high resistance between the germanium and the silicon substrate in this configuration. The current can only pass between the germanium and silicon via the narrow trenches that connect the two. The oxide that forms the trenches blocks current conduction in the other paths. This high resistance may reduce the efficiency of a solar cell.

The FIGS. 5a and 5b describes a possible approach for addressing these problems. An inverse solar cell may be grown on a Ge ART+ELO substrate as shown in FIG. 5a. First the high band-gap InGaP is grown, then GaAs, and then InGaAs. An GaInP buffer layer may be used between the GaAs and InGaAs to accommodate the difference in the lattice constant between InGaAs and GaAs. The InGaAs solar cell may be made quite thin, typically 2 micrometers, because InGaAs is a direct band-gap semiconductor, and therefore absorbs light efficiently. After the cells are grown, the wafer may be flipped over and bonded to a conductive handle wafer. The Ge ART+ELO substrate may then be removed by selective etching. The selective etching is preferably done very accurately because the silicon substrate, that will be removed, is far thicker than the compound semiconductor solar cell, that is not removed. This selective etching may be accomplished by using a very selective wet etch, such as KOH, which etches silicon quickly but etches germanium very slowly. The thin oxide and germanium ART+ELO layers may then be removed in another step, and this step is not nearly as challenging because these layers are not thick relative the compound semiconductor solar cell.

Inspection of the FIG. 5b shows the two problems described above have well addressed in the inverted cell approach. The InGaAs solar cell that absorbs the low energy light is thin enough to be grown on the Ge ART+ELO substrate without causing cracking. The handle wafer provides a low resistance path for the solar cell current.

What is claimed is:

1. A method of forming a structure, the method comprising:
   forming a first opening in a masking layer disposed over a substrate, the substrate comprising a first semiconductor material;
   forming, within the first opening, a first layer comprising a second semiconductor material lattice-mismatched to the first semiconductor material, the first layer having a thickness sufficient to extend above a top surface of the masking layer; and
   forming, on the first layer and over at least a portion of the masking layer, a second layer comprising the second semiconductor material,
   wherein a vertical growth rate of the first layer is greater than a lateral growth rate of the first layer and a lateral growth rate of the second layer is greater than a vertical growth rate of the second layer.

2. The method of claim 1, further comprising:
   prior to forming the first layer, forming a second opening in the masking layer;
   prior to forming the second layer, forming, within the second opening, the first layer; and
   forming, on the second layer, a third layer comprising the second semiconductor material, wherein the third layer coalesces between the first opening and the second opening.

3. The method of claim 2, wherein dislocation defects in the first layer are trapped within the first opening.

4. The method of claim 2, wherein the vertical growth rate of the first layer is increased by doping the first layer during formation thereof.

5. The method of claim 2, wherein the lateral growth rate of the first layer is reduced by doping the first layer during formation thereof.

6. The method of claim 2, wherein the lateral growth rate of the first layer is reduced by adjusting a growth parameter to create facets on a top surface of the first layer during formation thereof.

7. The method of claim 2, wherein reducing the vertical growth rate of the second layer comprises doping the second layer during formation thereof.

8. The method of claim 7, wherein reducing the vertical growth rate of the second layer comprises doping the second layer during formation thereof to form a first type of facet in the second layer and to suppress formation of a second type of facet in the second layer.

9. The method of claim 2, wherein increasing the lateral growth rate of the second layer comprises doping the second layer during formation thereof.

10. The method of claim 2, wherein the coalescence of the third layer is facilitated by doping the third layer during formation thereof.

11. The method of claim 2, further comprising, after forming the third layer, removing a top portion of the third layer to remove defects.

12. The method of claim 11, further comprising forming a photonic device on the third layer after the top portion is removed.

13. The method of claim 2, wherein a top portion of the first layer defines a facet non-parallel to a top surface of the substrate.

14. The method of claim 2, wherein the third layer is self-planarizing.

15. The method of claim 14, wherein the third layer is self-planarized by growing the third layer primarily in a (100) direction.

16. The method of claim 2, further comprising:
   forming a fourth layer on top of the third layer, the fourth layer comprising a third semiconductor material;
   forming a fifth layer on top of the fourth layer, the fifth layer comprising a fourth semiconductor material;
   bonding the fifth layer to a handle wafer; and
   removing the substrate.

17. The method of claim 16, wherein a bandgap of the third semiconductor material is greater than a bandgap of the fourth semiconductor material.

18. A method of forming a structure, the method comprising:
   forming an opening having a width $w_1$ in a masking layer disposed over a substrate, the substrate comprising a first semiconductor material;
   forming, within the opening, a first layer comprising a second semiconductor material lattice-mismatched to the first semiconductor material, the first layer extending vertically above a top surface of the masking layer and laterally to a width $w_2$ greater than $w_1$;
   removing a portion of the first layer, a remainder of the first layer having a thickness $t_1$ over a first area of the substrate proximate the opening;
   forming, on the first layer, a second layer comprising the second semiconductor material, the second layer extending laterally to a width $w_3$ greater than $w_2$; and
   removing a portion of the second layer, a remainder of the second layer having a thickness $t_2$ over a second area of the substrate proximate the opening.

19. The method of claim 18, wherein $t_1$ equals $t_2$.

20. The method of claim 18, wherein dislocation defects in the second semiconductor material are trapped in the opening.

21. The method of claim 18, wherein a portion of the first layer above the surface of the substrate is substantially free of dislocation defects.

22. The method of claim 18, wherein a vertical growth rate of the second semiconductor material is greater than a lateral growth rate of the second semiconductor material.

23. The method of claim 18, further comprising, after forming the second layer, removing a top portion of the second layer.

24. The method of claim 18, further comprising forming a photonic device on the second layer.

25. The method of claim 18, wherein a top portion of the first layer defines a facet non-parallel to a top surface of the substrate.

26. The method of claim 18, wherein the second layer is self-planarizing.

27. The method of claim 26, wherein the second layer is self-planarized by growing the second layer primarily in a (100) direction.

28. The method of claim 18, further comprising:
   forming a third layer on top of the second layer, the third layer comprising a third semiconductor material;
   forming a fourth layer on top of the third layer, the fourth layer comprising a fourth semiconductor material;
   bonding the fourth layer to a handle wafer; and
   removing the substrate.

* * * * *